United States Patent [19]

Tanaka et al.

[11] Patent Number: 4,490,208

[45] Date of Patent: Dec. 25, 1984

[54] METHOD OF PRODUCING THIN FILMS OF SILICON

[75] Inventors: Kazunobu Tanaka; Akihisa Matsuda, both of Ibaraki; Toshihiko Yoshida, Tokyo, all of Japan

[73] Assignee: Agency of Industrial Science and Technology, Tokyo, Japan

[21] Appl. No.: 394,074

[22] Filed: Jul. 1, 1982

[30] Foreign Application Priority Data

Jul. 8, 1981 [JP] Japan .................................. 56-105703
Jul. 8, 1981 [JP] Japan .................................. 56-105704

[51] Int. Cl.$^3$ ............................................. C30B 25/02
[52] U.S. Cl. .................................... 156/606; 156/614; 156/DIG. 64; 148/191; 136/258
[58] Field of Search ............... 156/610, 613, 606, 614, 156/DIG. 103, DIG. 89, DIG. 64; 148/191, 189; 204/192 S, 192 N, 164; 423/349, 348

[56] References Cited

U.S. PATENT DOCUMENTS 4,365,107 12/1982 Yamauchi ...................... 204/192 N

FOREIGN PATENT DOCUMENTS 2461763 3/1981 France ............................ 204/192 S

OTHER PUBLICATIONS

Thin Solid Films, 80 (1981-Jun.) 169–176, Saraie et al.

Primary Examiner—Hiram H. Bernstein
Attorney, Agent, or Firm—Seidel, Gonda & Goldhammer

[57] ABSTRACT

A method of producing thin films of silicon is characterized in that a p-type or n-type thin film of doped silicon having a dopant or impurity element is placed in a plasma atmosphere of elements selected from the group consisting of fluorine, chlorine, bromine, iodine, and hydrogen, whereby the concentration of an impurity element in the thin film is decreased adjacent to the surface of thin film and accordingly the impurity element is replaced by the plasma element adjacent to the surface of the thin film.

14 Claims, 5 Drawing Figures

METHOD OF PRODUCING THIN FILMS OF SILICON

BACKGROUND OF THE INVENTION

This invention relates to a method of producing thin films of silicon useful in such applications as diodes, solar cells, image pick up tubes, electrographic printers for readers and the like.

To suit their intended uses, thin films of silicon have been employed alone or generally in the form of p-i-n or p-n junction devices. Those devices are usually made in a process combining two or three film-forming steps, viz., by first forming a p-type thin film of silicon doped, e.g., with boron (B) as an impurity element, in a plasma atmosphere by glow discharge, and then allowing to grow thereon either an undoped i-type thin film of silicon as an active layer and an overlying phosphorus (P) doped n-type thin film of silicon or the latter directly without the intermediate layer. Alternatively, in a similar but reversed way, a thin film to constitute an n-type layer is formed first and then either i- and p-type layers are deposited thereon or the p-type layer is deposited directly on the n-type layer. A disadvantage common to the devices made by the conventional film-forming techniques is that, in the course of deposition of another layer over a grown layer, the impurity in the underlying (already grown) film tends to be released in the plasma atmosphere and gain entrance into the film being formed thereon. Consequently, as compared with a film deposited on an impurity-free substrate, the film that has grown up on an impurity-containing backing shows decreases in photoelectric and dark electric conductivities. This is particularly true with a p-i-n junction semiconductor device, consisting of a substrate and p-, i-, and n-type layers deposited thereon in order of mention, for fabrication into a solar cell. Ingress of the dopant impurity from the p-type to the i-type film lowers the photoelectric and dark electric conductivities and renders it impossible to provide good junctions. On the other hand, a device formed in the backward order, i.e., of the substrate, n-, i-, and p-type layers, cannot obtain adequate open voltage because the partial transfer of the impurity from the n-type to the i-type film causes a shift of the Fermi level position. Altogether, the aforesaid drawbacks lead to a decline in the photoenergy conversion efficiency, and those junctions in fact affect adversely the performance of the solar cells and other end products incorporating the same.

The present inventors have now found that, if a p- or n-type thin film of silicon doped with an impurity element is placed under a plasma discharge of the gas of at least one element chosen from among fluorine, chlorine, bromine, iodine, and hydrogen, the p- or n-type film will show a decrease in its impurity concentration in the portion from the surface to a depth of 5000 Å, and the dangling bonds that have resulted from the removal of the impurity from the p- or n-type silicon film are replaced by the plasma discharge gas, thus forming a barrier layer to avoid further release of the impurity from the silicon film in the plasma atmosphere.

It has also been found that the degree of impurity decrease in the thin film of silicon and the depth of film portion in which the impurity decrease takes place can be varied over broad ranges by adjusting the pressure during the plasma discharge inside the vacuum vessel, discharge time, and power density for discharge.

The pressure during the discharge, one of essential parameters for practicing the method of the invention, is controlled desirably within a range from $1.5 \times 10^{-2}$ to 3 torrs. If the discharge pressure is less than $1.5 \times 10^{-2}$ torr, the flow inside the vacuum vessel will become a diffusion or nonlaminar one with an increasing possibility of the once released impurity finding entrance back into the silicon film substrate. Thus, in order to keep the flow inside the vessel viscous or laminar, the pressure should be not less than $1.5 \times 10^{-2}$ torr. The upper limit of 3 torrs is put primarily by reason of apparatus factors, so as to prevent any discharge between the electrodes and the earth shields. The discharge power density varies depending on the properties of the plasma gas to be employed but a value between 0.5 and 50 W/cm$^2$ is suitable. Under these conditions the discharge time is variable as desired within a range from one second to five hours. With regard to the relation between the discharge power density and the discharge time, it may generally be said that the discharge power density influences the depth of the film portion in which the impurity element originally added as a dopant decreases, while the discharge time influences the decrease in the originally added impurity concentration.

The flow rate of the plasma element gas into the vacuum vessel to bring a plasma state must be so fixed as to stably maintain the plasma state. Experiments have indicated that a flow rate ranging from 0.5 to 100 SCCM gives good result.

The present invention is predicated upon the aforedescribed novel findings. Briefly, the method of producing thin films according to this invention is distinguishedly characterized in that a p-type or n-type thin film of silicon is placed in a state of plasma discharge of the gas of at least one element chosen from among fluorine, chlorine, bromine, iodine, and hydrogen, whereby the impurity concentration in the portion of the p- or n-type silicon film to a desired depth down to 5000 Å from the surface is decreased and the dangling bonds that have resulted from the impurity removal are replaced by the plasma discharge gas.

Thus, the p-type or n-type thin film of silicon produced in accordance with the invention, when subjected to a lowpower plasma discharge in the next process stage for deposition thereon, e.g., of an i-type film layer, will not release its impurity into the latter layer.

When a film is caused to grow in a plasma atmosphere on an n-type or p-type thin film substrate formed in a conventional way, the additional film will contain more than 10$^{16}$ atoms/cm$^3$ of the impurity from the substrate film. In contrast with that, when a film is grown likewise on a similar substrate formed by the method of the invention, the release of the impurity from the substrate film to the overlying film can be controlled within 10$^{16}$ atoms/cm$^3$.

Therefore, it is a primary object of this invention to provide a method of producing a p-type or n-type thin film of silicon which, upon exposure to a given plasma atmosphere, will release no (or little, if any) impurity with which it is doped to the exterior.

Another object of the invention is to provide a method of producing thin films of silicon useful in fabricating solar cells, image pick up tubes, electrographic printers for readers, diodes, etc., with good photoelectric and dark electric conductivities.

A further object of this invention is to provide a method of producing thin films of silicon, whereby a p-n- or p-i-n-type thin film of silicon can be made with fewer film-forming steps than in the prior art methods.

Other objects and advantages of the invention will become more apparent when reference is made to the following description and accompanying drawings.

DISCLOSURE OF THE INVENTION

In the practice of the present method, the starting thin film substrate of silicon to be subjected to the method of the invention may be a p-type or n-type thin film of silicon, such as a single-crystal semiconductor of silicon or an amorphous silicon semiconductor made by depositing a mixture of silane ($SiH_4$) and a dopant gas as a gaseous starting material on a given substrate in a plasma atmosphere. Also employable as a further alternative is the thin silicon film disclosed in a copending application by this applicant (Japanese patent application No. 143010/1980). The application discloses a thin film of silicon formed by mixing a dopant gas with either silane ($SiH_4$), or a halogenated silane ($SiH_{0-3}X_{4-1}$, where X represents a halogen element) or a gaseous mixture of two or more such silanes, as a gaseous starting material; diluting the gaseous mixture with helium, neon, argon or other rare gas, hydrogen, or the like in a ratio greater than about 1:1 so as to control the film-forming rate adequately and produce a crystalline-noncrystalline mixture layer; and applying an electric power with a plasma discharge power density of not less than about 0.2 $W/cm^2$.

The method of producing thin films of silicon in accordance with the invention will be described below in connection with examples thereof.

EXAMPLE 1

Figure 1:
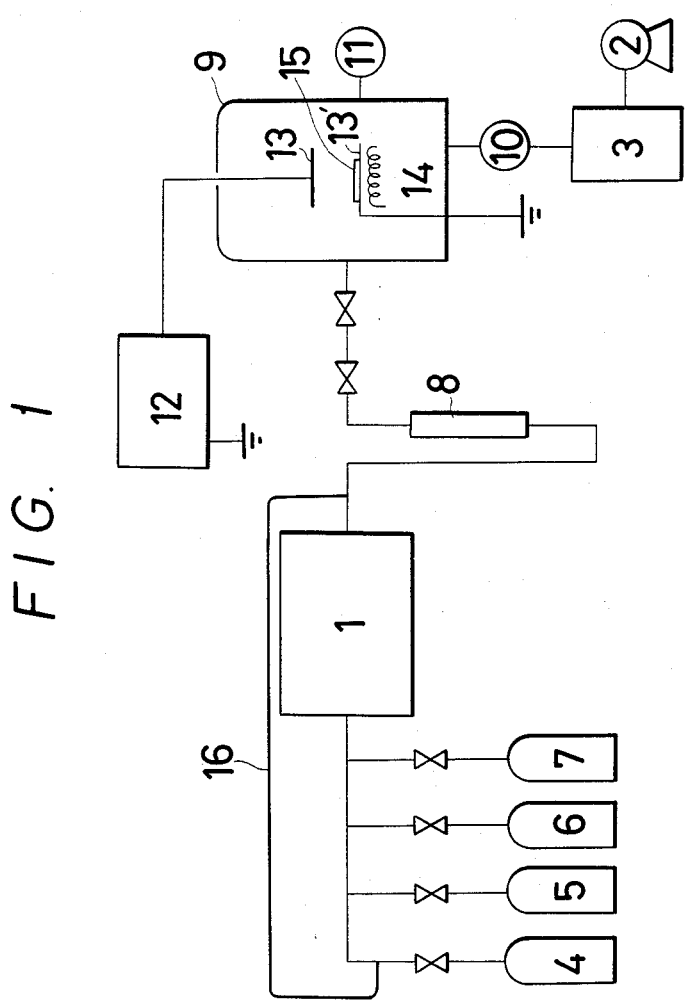
FIG. 1 is a schematic representation of apparatus for practicing a first method of producing a thin film of silicon in accordance with the invention.

Referring to FIG. 1, the whole system of arrangements including a mixing vessel 1 is kept at a vacuum degree of about $10^{-6}$ torr by means of an oil rotating pump 2 and an oil diffusion pump 3. The gases from a silane cylinder 4, hydrogen cylinder 5, and either a dopant gas (diborane or phosphine) cylinder 6 or 7 are introduced at predetermined rates into the mixing vessel 1, where they are mixed. The gaseous mixture is transferred through a flowmeter 8 into a vacuum vessel 9 at a constant flow rate. The vacuum in the vessel 9 is monitored with a vacuum indicator 11 and is maintained at a predetermined level through manipulation of main valve 10. A RF power supply 12 applies a RF voltage between electrodes 13 and 13' to cause a glow discharge. A substrate 15 is placed on a base preheated by a heater 14 and is heated to a predetermined temperature so as to be ready for the deposition thereon of a thin, doped film of silicon.

In this example the starting gaseous material was a 1:1 mixture of $SiH_4$ and $H_2$, with the addition of 2% (by volume) of diborane ($B_2H_6$) on the basis of the $SiH_4$ volume. The conditions under which a p-type thin film of silicon was formed prior to a treatment in a hydrogen plasma atmosphere were as follows: the plasma-discharge power density was 0.1 $W/cm^2$, material gas flow rate was 15 SCCM, substrate temperature was 300° C., and film-forming pressure was $5 \times 10^{-2}$ torr.

After the thin film of silicon has been formed in the foregoing way, the whole system including the vessel 9 was evacuated to about $10^{-6}$ torr by the pumps 2, 3. Next, hydrogen gas from the hydrogen cylinder 5 was directly supplied through line 16 to the flowmeter 8 and thence into the vacuum vessel 9 at a constant flow rate. The main valve 10 was operated and the vacuum in the vessel 9 was adjusted to 1 torr under observation through the vacuum indicator 11. Then, a high-frequency voltage of 13.56 MHz was applied between the electrodes 13 and 13' by the RF power supply 12 to effect a hydrogen-plasma glow discharge.

TABLE 1

| | Specimen No. | | | | |
|---|---|---|---|---|---|
| | 1 | 2 | 3 | 4 | 5 |
| Power density ($W/cm^2$) | — | 0.8 | 0.8 | 0.8 | 0.8 |
| Substrate temp. (°C.) | — | 300 | 300 | 300 | 300 |
| Discharge pressure (Torr) | — | 1 | 1 | 1 | 1 |
| Hydrogen flow rate (SCCM) | — | 10 | 10 | 10 | 10 |
| Discharge time (min) | — | 3 | 7 | 30 | 60 |
| Electric conductivity ($\Omega^{-1}cm^{-4}$) | $1.10 \times 10^{-4}$ | $3.69 \times 10^{-6}$ | $5.73 \times 10^{-7}$ | $4.55 \times 10^{-7}$ | $1.06 \times 10^{-6}$ |
| Optical band gap (a.u.) | 1.00 | 1.01 | 1.04 | 1.03 | 1.09 |
| Substrate conductivity type | Boron-doped p-type | | | | |

This gave a p-type, amorphous thin film of silicon whose surface portion had been freed of the impurity, with the resulting dangling bonds replaced by hydrogen. The hydrogen-plasma discharge condition, or discharge time, was varied and four different p-type, amorphous thin films of silicon were made. The results are shown in Table 1. Specimen No. 1 represents a p-type thin film of silicon made conventionally without subjection to a hydrogen plasma discharge. Specimen Nos. 2 to 5 are the p-type thin films of silicon made in conformity with the present invention, i.e., by a procedure such that the flow inside the apparatus was placed in a viscous flow region by adjusting the hydrogen gas flow rate and the pressure during the hydrogen plasma discharge so that the boron once released from the walls of the vacuum vessel and the thin film of silicon may not reenter the silicon film.

Figure 2:
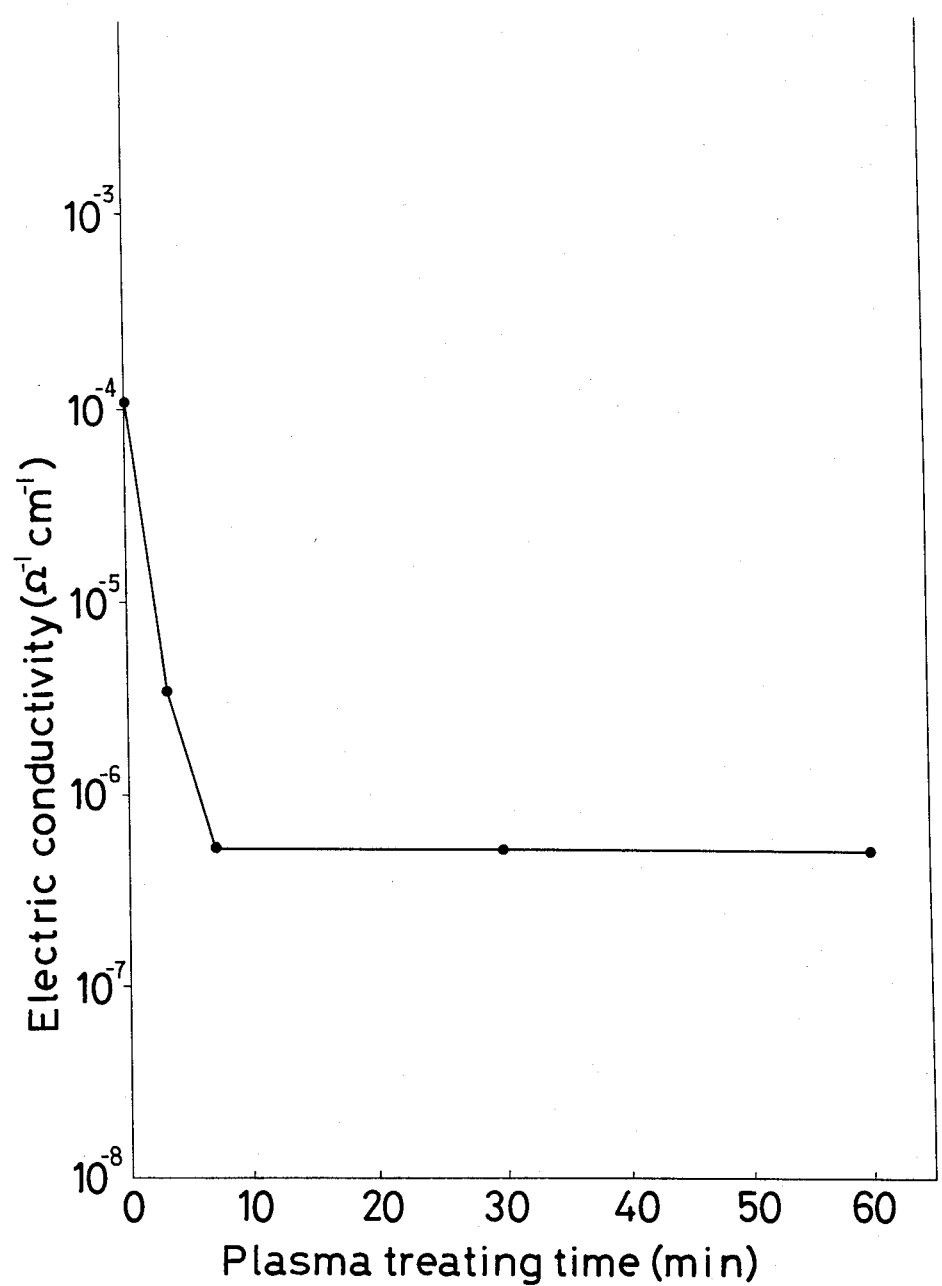
FIG. 2 is a graph showing the electric conductivity of the thin film of silicon made by the first method of the invention as a function of plasma discharge time.
Figure 3:
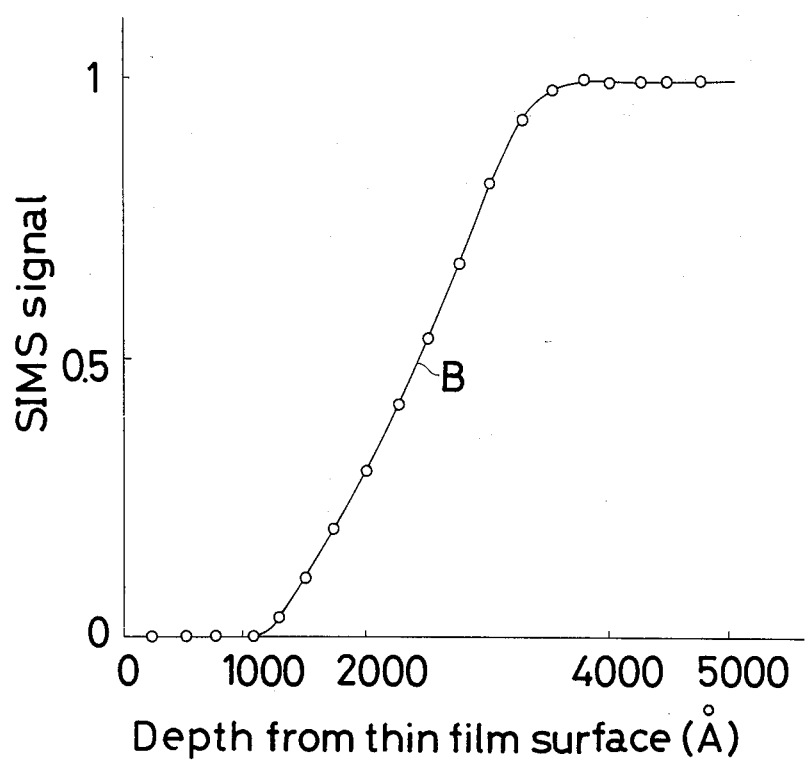
FIG. 3 is a graph in which the results of SIMS measurement of the thin silicon film produced by the first method are plotted.

FIG. 2 is a graphic representation of the electric conductivity of the thin silicon film made in accordance with the invention as a function of hydrogen-plasma treating time. The graph indicates that the method of the invention reduced the boron atom concentration in the surface portion of the silicon film. Also, it was confirmed by a SIMS measurement that the p-type thin film according to the invention was completely free from boron atom in the portion from the surface to the depth of 1000 Å. (Refer to FIG. 3.)

EXAMPLE 2

An n-type thin film of silicon was formed by the same procedure as described in Example 1 except that phosphine ($PH_3$) was used instead as the dopant, and the thin film so obtained was treated with a hydrogen plasma in the same way as in the preceding example.

By a SIMS measurement complete removal of phosphorus atoms from a 500 Å-deep portion of the n-type thin film according to the invention was confirmed.

From the foregoing description it will be understood by those skilled in the art that the p-type or n-type thin film of silicon produced by the method of the invention permits the manufacture of a pn or pin junction device by a subsequent step of ordinary film-forming technique. A pin-junction semiconductor device, made by depositing, on a p-type (or n-type) film formed in accordance with the invention, an i-type film and then an n-type (or p-type) film, provides a better p-i (or n-i) junction than existing devices of the character. Similarly, a p-n junction semiconductor device, obtained by depositing an n-type (or p-type) film on a p-type (or n-type) film according to the invention, gives a better p-n junction than ordinary ones. It is also possible to apply this invention to a p-type film substrate and thoroughly remove the impurity from the surface portion of the substrate film to convert the substrate to a p-i-type thin film of silicon. In that case an n-type film may be deposited on the p-i-type film to yield a p-i-n junction semiconductor device.

As a result of further researches and experiments, the present inventors have now found that, if a p- or n-type thin film substrate of silicon doped with an impurity element is placed under a plasma discharge of a gaseous mixture of the gas of at least one element selected from the group consisting of fluorine, chlorine, and hydrogen, and a gas of an impurity dissimilar to the impurity in the silicon film substrate, the silicon film substrate will show a decrease in its impurity concentration in the portion from the surface to a depth of 5000 Å while, at the same time, the substrate is doped to a desired depth with the dissimilar impurity in the gaseous mixture.

It has also been found that the degree of impurity decrease in the thin film substrate of silicon, the depth of the film portion in which the impurity decrease takes place, and the concentration and depth of doping with the new, dissimilar impurity in the same substrate can be varied over broad ranges by adjusting (1) the composition of the gaseous mixture to be placed under the plasma discharge conditions, (2) the pressure during, and the duration of, the plasma discharge in the vacuum vessel, and (3) the plasma-discharge power density.

The present invention is predicated upon the aforedescribed novel findings. Briefly, the method of producing thin films of silicon in accordance with the invention is distinguishedly characterized in that a thin film substrate of silicon doped with an impurity (A) is placed in a plasma discharge state of a gaseous mixture consisting of the gas of an element selected from the group consisting of fluorine, chlorine, and hydrogen, and a gas containing an impurity (B) dissimilar to the impurity (A) in the silicon film substrate, whereby the concentration of the impurity (A) is decreased in the portion of the silicon film substrate from the surface to a predetermined depth while, at the same time, the substrate is doped to a desired depth with the impurity (B).

Dangling bonds that have resulted from the removal of the impurity (A) presumably combine with fluorine or hydrogen atoms.

By way of example, it is assumed that a p-n junction device is made in accordance with the present invention by doping a p-type thin film of silicon containing boron atoms as impurity with phosphorus atoms diffused from one side. To this end, the p-type thin film substrate of silicon is exposed to a plasma discharge of a gaseous mixture which consists of either phosphine, $PH_3$, diluted with hydrogen or phosphorus pentafluoride diluted with fluorine. The result is that the boron atom concentration in the p-type silicon film substrate is reduced in the portion from the surface to a desired depth, simultaneously with doping to a given depth in the same substrate with phosphorus atoms out of the gaseous mixture. In this way a p-n junction device is made without the need of any film-forming process. Another example will be cited in which a p-n junction device is made under the invention by boron-atom doping of an n-type thin film substrate of amorphous silicon containing phosphorus atoms as impurity. In this case, the n-type silicon film substrate is exposed to a plasma discharge of a gaseous mixture which consists of diborane, $B_2H_6$, diluted with hydrogen or of boron trifluoride diluted with fluorine. This operation reduces the phosphorus atom concentration in the n-type silicon film substrate in the portion from the surface to a desired depth while, at the same time, doping the same film to a given depth with boron atoms out of the gaseous mixture. A p-n junction device is made in this way without any film-forming process.

In either case the depth of impurity reduction and the depth of doping with the other impurity can be controlled by changing the composition, or mixing ratio, of the gaseous mixture. By so doing varied p-n junction devices and also p-i-n junction devices having various desired properties can be obtained. To be more specific, the composition of the gaseous mixture is a parameter as important as the pressure and duration of the discharge and the power density in practicing the method of the invention. The gas composition is such that, when the [impurity (B) gas/fluorine or hydrogen gas] ratio is low, the depth of doping from the surface with the new impurity (B) will be less than the depth down to which the concentration of the originally added impurity (A) is decreased in the silicon film substrate through the agency of fluorine or hydrogen. Therefore, the resulting device is a p-i-n junction. On the other hand, when the [impurity (B) gas/fluorine or hydrogen gas] ratio is high, the depth of the silicon film substrate portion in which the concentration of the impurity (A) is decreased by fluorine or hydrogen and the depth of doping with the new impurity (B) are substantially the same. Hence, the product is a p-n junction device. In the practice of this invention it has been found that a desirable gaseous mixture composition is $B_2H_6$, $BF_3/H_2$ or $PH_3$, $PF_5/H_2$ in a range of $10^{-5}$ to $10^{-1}$. The rate of flow of the gaseous mixture into the vacuum vessel must be so chosen as to keep the plasma condition stable. Experiments showed that a flow rate between 0.5 and 100 SCCM gives good result.

The pressure during the discharge, one of essential parameters for practicing the method of the invention, is controlled desirably within a range from $1.5 \times 10^{-2}$ to 3 torrs. If the discharge pressure is less than $1.5 \times 10^{-2}$ torr, the flow inside the vacuum vessel will become a diffusion one with an increasing possibility of the once released impurity finding entrance back into the silicon film substrate. Thus, in order to keep the flow inside the vessel viscous, the pressure should be not less than $1.5 \times 10^{-2}$ torr. The upper limit of 3 torrs is put primarily by reason of apparatus factors, so as to prevent any discharge between the electrodes and the earth shields. The discharge power density varies depending on the properties of the plasma gas be employed but a value between 0.5 and 50 W/cm² is suitable. Under these conditions the discharge time is variable as desired within a range from one second to five hours. With regard to the relation between the discharge power density and the discharge time, it may generally be said that the discharge power density influences the depth of the film portion in which the impurity element originally added as a dopant decreases and also the depth of doping with the newly added impurity, while the discharge time influences the decrease in the originally added impurity concentration and the degree of doping with the new impurity.

EXAMPLE 3

Figure 4:
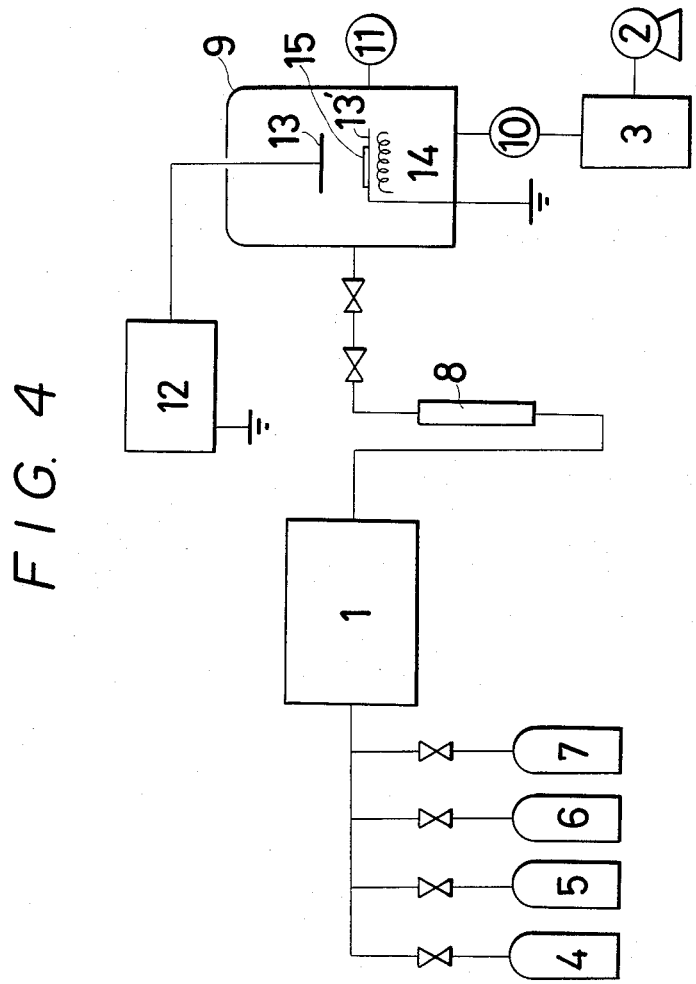
FIG. 4 is a schematic representation of an apparatus for practicing a second method of producing a thin film of silicon in accordance with the invention.
Figure 5:
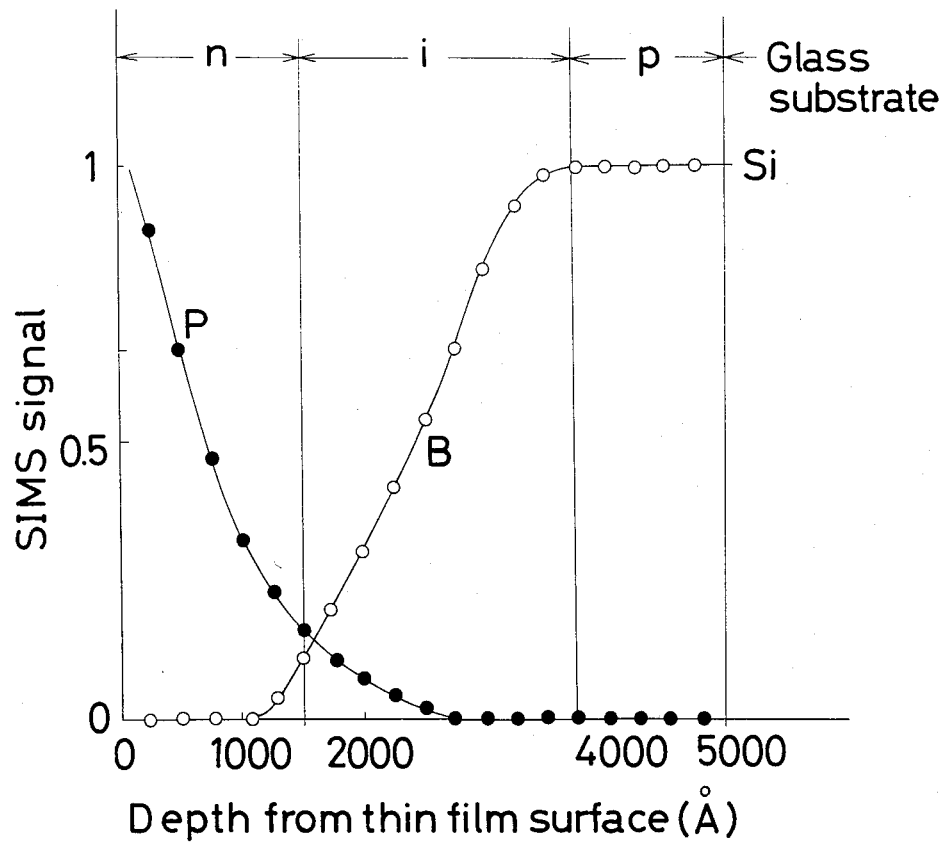
FIG. 5 is a graph in which the results of SIMS measurement of the thin silicon film produced by the second method are plotted.

Referring to FIG. 4, the whole system of arrangements including a mixing vessel 1 is kept at a vacuum degree of about $10^{-6}$ torr by means of an oil rotating pump 2 and an oil diffusion pump 3. The gases from a silane cylinder 4 or hydrogen cylinder 5, and either a dopant gas (diborane or phosphine) cylinder 6 or 7 are introduced at predetermined rates into the mixing vessel 1, where they are mixed. The gaseous mixture is transferred through a flowmeter 8 into a vacuum vessel 9 at a constant flow rate. Through manipulation of a main valve 10 the vacuum in the vessel 9, while being monitored with a vacuum indicator 11, is maintained at a predetermined level. The flow condition in the vacuum vessel is adjusted to be in a viscous flow region so as to prevent the impurity once released out of the substrate film from gaining entrance back into the film. This end is achieved primarily by maintaining a pressure of not lower than $1.5 \times 10^{-2}$ torr in the vacuum vessel. A RF power supply or DC source 12 is used to apply a high-frequency voltage between electrodes 13 and 13' to produce a glow discharge. As a substrate 15, either an n-type or p-type thin film substrate of silicon is employed. The substrate film desirably ranges in thickness from 0.1 to 1 μm, while a 0.7 μm-thick film was used in this example. The substrate 15 was placed on a base plate preheated by a heater 14, and is heated to a desired temperature. By the procedure so far described the thin film substrate of silicon is converted to a p-n or p-i-n junction device.

Table 2 summarizes this example of the method according to the invention. The film-forming conditions for the p-type thin film substrate of silicon used were as follows. A 1:1 gaseous mixture of $SiH_4$ and $H_2$ was used as the starting gaseous material, with the addition of 2% (by volume) of diborane, $B_2H_6$, as a dopant on the basis of the $SiH_4$ volume. The plasma-discharge power density was 0.1 W/cm², film-forming pressure was $5 \times 10^{-2}$ torr, material gas flow rate was 15 SCCM, and the film-forming time was 60 minutes. The p-type silicon substrate was made on an ITO transparent electrode under the film-forming conditions described in Example 1.

TABLE 2

|  | Spec. No. 1 | Spec. No. 2 |
| --- | --- | --- |
| Carrier gas | $H_2$ | $H_2$ |
| Doping gas composition (by volume) | $PH_3/H_2 = 2\%$ | $PH_3/H_2 = 2\%$ |
| Gas flow rate (SCCM) | 5 | 5 |
| Power density (W/cm²) | 1.3 | 0.8 |
| Substrate temperature (°C.) | 300 | 300 |
| Discharge pressure (torr) | $3 \times 10^{-1}$ | $3 \times 10^{-1}$ |
| Discharge time (min) | 60 | 30 |
| Substrate conductivity type | p | p |

The devices of Specimen Nos. 1 and 2 in Table 2 were found to be rectifying because of their V-i characteristics, and this indicated that actually p-n junction devices had been made.

Specimen No. 2 was subjected to an EMX measurement and was tested for gas release on heating. The results showed that the p-type silicon film had contained 4 atom.% of phosphorus atoms as an evidence of doping with phosphorus atoms according to the method of the invention.

EXAMPLE 4

In the same way as described in Example 3, a p-i-n junction device was made by treating a boron-doped, p-type thin film substrate of amorphous silicon (5000 Å in thickness) in a plasma atmosphere of a gaseous mixture of $PH_3$ gas and hydrogen gas. From its V-i characteristic the product was confirmed to be a p-i-n junction device. FIG. 6 gives the results of SIMS measurement. It will be understood from this graph that the boron concentration in the substrate film decreases in the portion from the surface to a depth of 3500 Å and that the film is newly doped with phosphorus out of the gaseous mixture.

As has been described hereinabove, the method of the invention renders it possible to reduce the impurity concentration in a p- or n-type thin film substrate of silicon from the surface to a given depth and simultaneously dope the silicon film with a new impurity. Consequently, the method of the invention permits the manufacture of p-n or p-i-n junction devices with fewer film-forming steps than in ordinary methods. The invention thus offers advantages of simplified process and increased productivity of silicon semiconductors, with the possibility of producing diodes, solar cells, etc. of improved performance.

What is claimed is:

1. A method of producing a thin film of silicon comprising subjecting a thin film of silicon doped with an impurity element to a plasma atmosphere consisting essentially of gas selected from the group consisting of fluorine, chlorine, bromine, iodine, hydrogen and mixtures thereof to reduce the concentration of the impurity element in the doped silicon film adjacent to a surface of the silicon film by removing at least a portion of the impurity element adjacent to the surface of the silicon film.

2. A method of producing a thin film of silicon comprising subjecting a thin film of silicon doped with an impurity element to a plasma atmosphere consisting essentiallly of gas selected from the group consisting of fluorine, chlorine, bromine, iodine, hydrogen and mixtures thereof to reduce the concentration of the impurity element in the doped silicon film adjacent to a surface of the silicon film by removing at least a portion of the impurity element adjacent to the surface of the silicon film and deterring reentry of the removed impurity element released into the plasma atmosphere by flowing the plasma atmosphere along the surface of the silicon film in substantially laminar flow.

3. The method as defined in claim 2, further comprising maintaining the pressure of the plasma atmosphere in the range from $1.5 \times 10^{-2}$ to 3 torrs.

4. The method as defined in claim 2, further comprising maintaining the flow rate of the plasma atmosphere between 0.5 to 100 SCCM.

5. The method as defined in claim 1, further comprising controlling the depth of the silicon film portion in which the concentration of the impurity element is reduced by maintaining the electric power density applied to the plasma atmosphere within a range from 0.5 to 50 W/cm$^2$.

6. The method as defined in claim 1, further comprising subjecting the thin film of doped silicon to a vacuum of $10^{-6}$ torr prior to subjecting the silicon film to the plasma atmosphere.

7. A method of producing a thin film of silicon comprising subjecting a thin film of silicon doped with an impurity element to a plasma atmosphere consisting essentially of gas selected from the group consisting of fluorine, chlorine, bromine, iodine, hydrogen and mixtures thereof to reduce the concentration of the impurity element in the doped silicon film adjacent to a surface of the silicon film by removing at least a portion of the impurity element adjacent to the surface of the silicon film and depositing an n-type thin film of silicon on the surface of the silicon film after the impurity element concentration has been reduced when the impurity element is of the p-type and depositing a p-type thin film of silicon on the surface of the silicon film after the impurity element concentration has been reduced when the impurity element is of the n-type.

8. A method of producing a thin film of silicon comprising subjecting a thin film of silicon doped with an impurity element to a plasma atmosphere consisting essentially of gas selected from the group consisting of fluorine, chlorine, bromine, iodine, hydrogen and mixtures thereof to reduce the concentration of the impurity element in the doped silicon film adjacent to a surface of the silicon film by removing at least a portion of the impurity element adjacent to the surface of the silicon film and depositing an i-type thin film of silicon on the surface of the silicon film after the impurity element concentration has been reduced and depositing on the i-type silicon film a n-type thin film of silicon when the impurity element is of the p-type and depositing a p-type thin film of silicon on the i-type silicon film when the impurity element is of the n-type.

9. A method of producing a thin film of silicon comprising subjecting a thin film of silicon doped with a first impurity element to a plasma atmosphere consisting of a gaseous mixture of a first gas selected from the group consisting of fluorine, chlorine, hydrogen and mixtures thereof and a second gas containing a second impurity element dissimilar to the first impurity element to reduce the concentration of the first impurity element in the film of silicon adjacent to a surface of the silicon film by removing at least a portion of the first impurity element adjacent to the surface of the silicon film and simultaneously doping the silicon film adjacent to the surface with the second impurity element.

10. A method of producing a thin film of silicon comprising subjecting a thin film of silicon doped with a first impurity element to a plasma atmosphere consisting of a gaseous mixture of a first gas selected from the group consisting of fluorine, chlorine, hydrogen and mixtures thereof and a second gas containing a second impurity element dissimilar to the first impurity element to reduce the concentration of the first impurity element in the film of silicon adjacent to a surface of the silicon film by removing at least a portion of the first impurity element adjacent to the surface of the silicon film and simultaneously doping the silicon film adjacent to the surface with the second impurity element and deterring reentry of the removed first impurity element released into the plasma atmosphere by flowing the plasma atmosphere along the surface of the silicon film in substantially laminar flow.

11. The method as defined in claim 10, further comprising maintaining the pressure of the plasma atmosphere in the range from $1.5 \times 10^{-2}$ to 3 torrs.

12. The method as defined in claim 10, further characterized by maintaining the flow rate of the plasma atmosphere between 0.5 to 100 SCCM.

13. The method as defined in claim 9, further comprising controlling the depth of the film portion in which the first impurity concentration is reduced and the second impurity concentration is increased by maintaining the power density within a range of 0.5 to 50 W/cm$^2$ and varying the ratio of the second impurity element to the remainder of the plasma atmosphere within a range of $10^{-5}$ to $10^{-1}$.

14. The method as defined in claim 9, further comprising subjecting the thin film of doped silicon to a vacuum of $10^{-6}$ torr prior to subjecting the silicon film to the plasma atmosphere.

* * * * *

UNITED STATES PATENT AND TRADEMARK OFFICE
CERTIFICATE OF CORRECTION

PATENT NO. : 4,490,208
DATED : December 25, 1984
INVENTOR(S) : Kazunobu Tanaka et al.

It is certified that error appears in the above—identified patent and that said Letters Patent is hereby corrected as shown below:

On the front sheet, the Assignee line reading "Agency of Industrial Science and Technology, Tokyo, Japan" should read -- Agency of Industrial Science and Technology, Tokyo, Japan and Toa Nenryo Kogyo K.K., Tokyo, Japan --.

Signed and Sealed this

Twenty-third Day of July 1985

[SEAL]

*Attest:*

DONALD J. QUIGG

*Attesting Officer*     *Acting Commissioner of Patents and Trademarks*